(12) United States Patent
Hassun

(10) Patent No.: US 7,514,970 B2
(45) Date of Patent: Apr. 7, 2009

(54) DECIMAL FREQUENCY SYNTHESIZER

(75) Inventor: Roland Hassun, San Mateo, CA (US)

(73) Assignee: Giga-Tronics, Inc., San Ramon, CA (US)

(*) Notice: Subject to any disclaimer, the term of this patent is extended or adjusted under 35 U.S.C. 154(b) by 83 days.

(21) Appl. No.: 11/508,426

(22) Filed: Aug. 23, 2006

(65) Prior Publication Data

US 2008/0048733 A1 Feb. 28, 2008

(51) Int. Cl.
*H03K 21/00* (2006.01)
(52) U.S. Cl. ..................... 327/115; 327/117
(58) Field of Classification Search .............. 327/159, 327/115, 117, 105, 106, 107
See application file for complete search history.

(56) References Cited

U.S. PATENT DOCUMENTS

| | | | |
|---|---|---|---|
| 3,928,813 A | 12/1975 | Kingsford-Smith | |
| 4,516,084 A | 5/1985 | Crowley | |
| 4,609,881 A | 9/1986 | Wells | |
| 4,951,004 A * | 8/1990 | Sheffer et al. | 331/1 A |
| 5,028,887 A | 7/1991 | Gilmore | |
| 5,038,117 A | 8/1991 | Miller | |
| 5,088,057 A * | 2/1992 | Amrany et al. | 708/103 |
| 5,351,014 A | 9/1994 | Ichiyoshi | |
| 5,373,255 A * | 12/1994 | Bray et al. | 331/1 A |
| 5,757,239 A * | 5/1998 | Gilmore | 331/18 |
| 5,859,570 A | 1/1999 | Itoh et al. | |
| 6,198,353 B1 * | 3/2001 | Janesch et al. | 331/16 |
| 6,337,589 B1 * | 1/2002 | Ooishi | 327/156 |
| 6,366,174 B1 * | 4/2002 | Berry et al. | 331/78 |
| 6,509,800 B2 * | 1/2003 | Stockton | 331/11 |
| 6,515,525 B2 * | 2/2003 | Hasegawa | 327/156 |
| 6,809,598 B1 * | 10/2004 | Staszewski et al. | 331/16 |
| 6,845,139 B2 * | 1/2005 | Gibbons | 377/47 |
| 6,919,744 B2 * | 7/2005 | Paist et al. | 327/115 |
| 6,944,257 B2 * | 9/2005 | Riley | 377/47 |
| 7,042,258 B2 * | 5/2006 | Booth et al. | 327/115 |

* cited by examiner

*Primary Examiner*—Kenneth B. Wells
(74) *Attorney, Agent, or Firm*—Menlo Patent Agency LLC

(57) ABSTRACT

A frequency synthesizer and method for synthesizing decimal frequencies. The synthesizer includes a seed generator, a clock synthesizer and an output synthesizer. The clock synthesizer includes a binary accumulator in a feedback signal path using a base reference frequency and a clock seed word for synthesizing a clock frequency and the output synthesizer includes a binary accumulator in a forward signal path using the clock frequency and an output seed word for synthesizing an output frequency. The output frequency is synthesized in decimal frequency steps from a decimal base reference frequency. Several output synthesizers may be driven in parallel from the same clock frequency for synthesizing several output frequencies in parallel.

29 Claims, 4 Drawing Sheets

DECIMAL FREQUENCY SYNTHESIZER

BACKGROUND OF THE INVENTION

1. Field of the Invention

This invention relates generally to signal frequency synthesis and more particularly to a frequency synthesizer and method for synthesizing exact multiples of decimal frequencies.

2. Description of the Background Art

Microwave frequency synthesizers play a crucial role in consumer, industrial and military applications. They are found in test systems for cell phones, radars and communication transceivers. The performance, cost and size of a synthesizer has a very substantial impact on commercial success and operational viability in numerous instances. Low phase noise, low spurious signal levels and fast switching speed are key performance factors.

Architectures for microwave frequency synthesis fit into the two broad categories of direct synthesis and indirect synthesis. The direct synthesis architectures use analog components such as mixers, filters, switches, frequency multipliers and frequency dividers for simple direct arithmetic frequency operations of addition, subtraction, multiplication and division. The resulting solutions have high performance, but when applied in the microwave frequency range, are costly, bulky and have high power consumption.

Indirect synthesis architectures make use of phase lock loops (PLL)s in the signal-switching-path. Single switching loop PLL architectures have low cost, small size and low power consumption by virtue of their simplicity. Such simple architectures are currently used in applications that do not require the level of performance demanded in military and high volume test applications. However, to meet a high level of performance, existing products use multiple phase-locked loops, sometimes as many as 8 or 10, in the signal switching path. As a result, the PLL implementations of high performance frequency synthesizers are also costly and bulky, and have high power consumption.

Both direct and indirect frequency synthesis use a reference frequency derived from a base reference oscillator for providing a highly stable, low phase noise signal from which all other frequencies are synthesized. While it is theoretically possible to use a base reference oscillator at any frequency, an oscillator having a decimal frequency of 10 MHz or 100 MHz is highly preferred because a great deal of engineering has gone into achieving high stability and low phase noise for the lowest cost for oscillators having these frequencies. Relatively low cost binary devices are used for fractional multiplication of the reference frequency for synthesizing the desired output frequency.

Frequency synthesis of exact multiples of 10 kHz, 100 kHz or 1 MHz is often desirable for communication and radar receiver test, and direct use as local oscillators in receivers and transmitters. These receivers and transmitters commonly use channel spacings that have exact decimal Hertz values (sums of multiples of 100 kHz). For example, GSM may have a channel spacing of exactly 200 kHz. Unfortunately, a 10 MHz or 100 MHz reference oscillator with fractional binary multiplication cannot directly provide steps sizes to exactly match these channel spacings. Of course, this problem can be resolved with ultra-fine resolution so that the frequency difference between the desired and actual step size is negligible. However, ultra-fine frequency resolution is expensive to achieve. The problem could be resolved using a binary base reference frequency, for example $2^{25}$ at 33.554,432 MHz or $2^{26}$ at 67.108864 MHz. However, base reference oscillators at these frequencies do not have all the benefits of existing base reference oscillators having decimal base frequencies of 10 MHz or 100 MHz.

There is a need for a low phase noise, low spurious signal level, fast switching microwave synthesizer at a low cost having frequency steps at exact multiples of a decimal frequency using a decimal frequency base reference frequency.

SUMMARY OF THE INVENTION

The present invention has embodiments for apparatus and methods for providing low phase noise, low spurious signal level and fast switching at a low cost for frequency steps at exact multiples of decimal frequencies. A decimal frequency is defined herein as a multiple of a ten Hertz.

Briefly, a frequency synthesizer of a preferred embodiment includes a seed generator, a clock synthesizer and an output synthesizer. The clock synthesizer includes a first accumulator used as a divider in a feedback loop for binary fractional multiplication of a first reference frequency for synthesizing a clock frequency. The output synthesizer clocks a second accumulator with the clock signal for binary fractional division of the clock frequency for synthesizing a second reference frequency. The output synthesizer also includes a tracking filter for filtering and multiplying the second reference frequency for synthesizing an output frequency. The seed generator provides seed words for the two accumulators. The first reference frequency is an exact multiple of a base reference oscillator frequency that is an exact multiple of a decimal frequency. The two seed words, the first reference frequency, and the arrangement of the two accumulators synthesizes exact multiples of decimal frequency steps from a 10 MHz or 100 MHz base reference frequency. Several output synthesizers may be driven in parallel from the same clock frequency for synthesizing several output frequencies in parallel.

In a preferred embodiment, the present invention is a frequency synthesizer, comprising: a clock synthesizer having a clock synthesis accumulator for accumulating a selected clock seed word with a clock frequency in a feedback signal path for synthesizing the clock frequency from a base reference frequency; and an output synthesizer having an output synthesis accumulator for accumulating selected output seed words with the clock frequency in a forward signal path for synthesizing output frequencies at decimal divisions of the base reference frequency.

In another preferred embodiment, the present invention is a method for synthesizing a frequency, comprising: accumulating a selected clock seed word with a clock frequency in a feedback signal path for synthesizing the clock frequency from a base reference frequency; and accumulating selected output seed words with the clock frequency in a forward signal path for synthesizing output frequencies at decimal divisions of the base reference frequency.

An advantage of the invention is that very fine resolution is not required for using a decimal base referenced frequency for synthesizing decimal frequency steps.

Another advantage of the invention is that a single clock synthesizer may be used for simultaneously clocking several output synthesizers, thereby reducing cost for synthesizing several output frequencies. Phase tracking between the different output synthesizers is especially good in this configuration due to the common reference being at a high frequency.

Another advantage of the invention is that a low phase noise, low spurious signal level is synthesized at a low cost for decimal frequencies with a fast switching speed commensurate with the frequency step sizes.

These and other embodiments and advantages of the present invention will no doubt become obvious to those of ordinary skill in the art after viewing the various drawings and reading the following detailed description of the preferred embodiments for carrying out the invention.

BEST MODE FOR CARRYING OUT THE INVENTION

Figure 1:
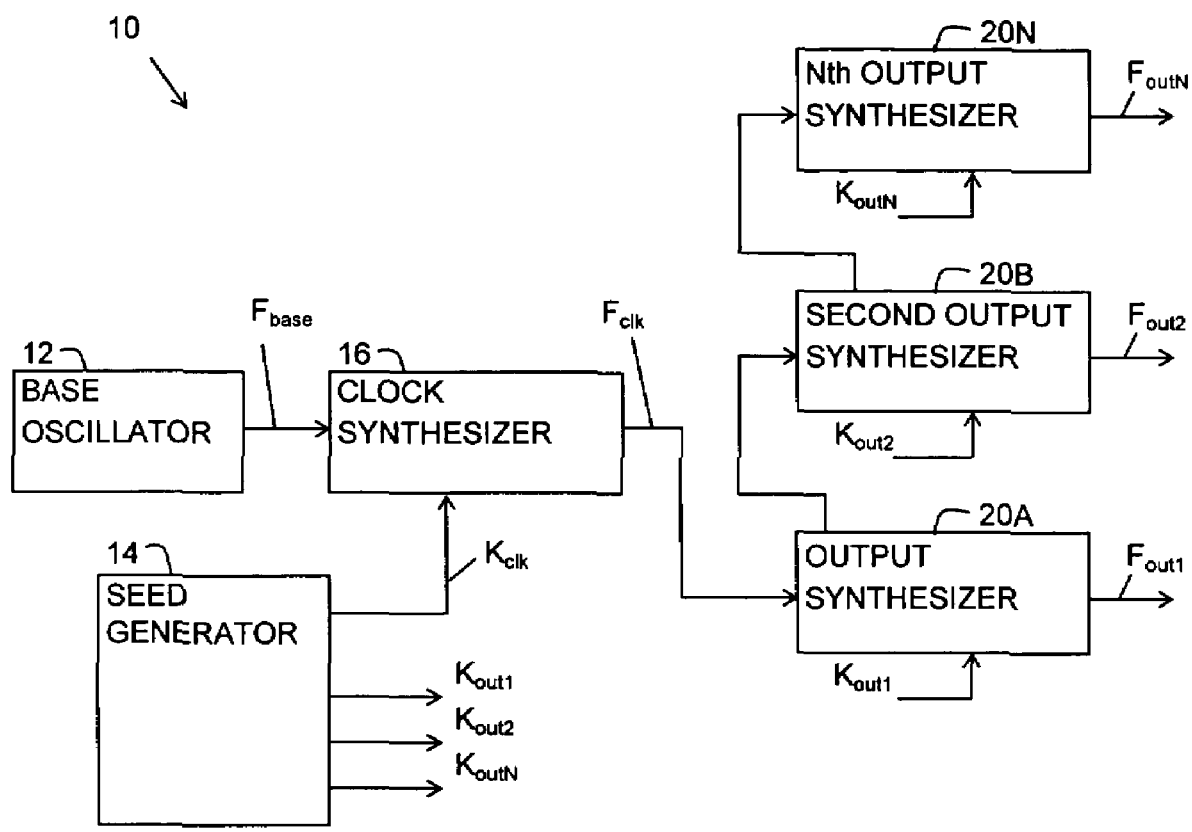
FIG. 1 is a block diagram of a decimal frequency synthesizer of the present invention.

The details of the preferred embodiments for carrying out the invention will now be presented. Specific numbers are illustrated in the drawings and described in the detailed descriptions for examples of frequencies, frequency multiplications and frequency divisions. However, it should be understood that the descriptions and illustrations of these details and numerical examples are not intended to limit the invention to these details or numbers. On the contrary, the details and numbers only describe specific examples of preferred embodiments for carrying out the idea of the invention. It is expected that alternatives, modifications and equivalents for other embodiments will be apparent to someone skilled in the art as within the scope of the idea.

The details of the preferred embodiments are shown by the figures and accompanying descriptions for providing an output signal in the microwave frequency range. It is appreciated by those skilled in the art that available components and parasitic effects are more limiting for microwave frequencies than for lower frequencies. Therefore, ideas that have been developed for lower frequencies are not necessarily relevant to the microwave art of the present invention. The microwave frequency range is considered to be frequencies greater than one Gigahertz (GHz) up to at least one hundred GHz.

FIG. 1 is a block diagram of a decimal frequency synthesizer of the present invention referred to with a reference number 10. The frequency synthesizer 10 includes a base reference oscillator 12, a seed generator 14, a clock synthesizer 16 and one or more output synthesizers 20A-N for providing synthesized output frequencies Fout1-FoutN. The oscillator 12 generates a signal at a base reference frequency Fbase. In an alternative embodiment, an external signal source may be used for providing the frequency Fbase. The seed generator 14 generates a clock seed word Kclk for the clock synthesizer 16 and output seed words Kout1-KoutN for the output synthesizers 20A-N, respectively. The clock and output seed words Kclk and Kout1-KoutN have integer (or whole number) values, for example one, two, three and so on.

The clock synthesizer 16 uses the base frequency Fbase and the clock seed word Kclk for synthesizing a clock frequency Fclk. The synthesized clock frequency Fclk is passed on as a clock signal to the output synthesizers 20A-N. All the output synthesizers 20A-N use the same synthesized clock frequency Fclk and different output seed words Kout1-KoutN, respectively, for synthesizing the output frequencies Fout1-FoutN, respectively. Each of the output frequencies Fout1-FoutN is individually selected at an exact multiple of a decimal frequency according to the corresponding output seed word Kout1-KoutN, respectively.

An important feature of the synthesizer 10 is that the output frequency Fout1 can be incremented by a decimal frequency step $\Delta F1$, for example 10 kHz, 100 kHz or 1 MHz, that is an exact multiple of a decimal frequency by incrementing the output seed word Kout1 by an integer output seed word step $\Delta$Kout1. The frequency exactness of the frequency step $\Delta F1$ is proportional to the frequency exactness of the base frequency Fbase. At the same time, using the same clock seed word Kclk and the same clock frequency Fclk, the output frequency Fout2 can be incremented by an exact multiple of a decimal frequency step $\Delta F2$ by incrementing the output seed word Kout2 by an integer output seed word step $\Delta$Kout2, and so on through output frequency FoutN, the frequency step $\Delta FN$ and integer output seed word step $\Delta$KoutN.

Figure 2:
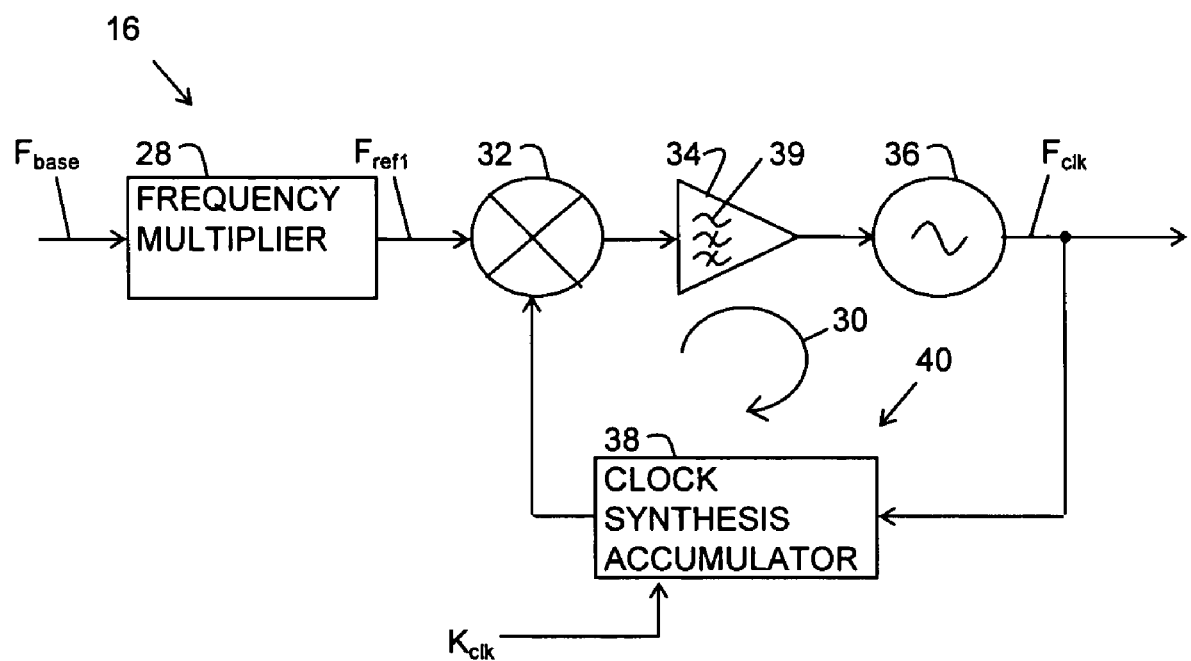
FIG. 2 is a block diagram of a clock synthesizer of the decimal frequency synthesizer of FIG. 1.

FIG. 2 is a block diagram of the clock synthesizer 16. The clock synthesizer 16 includes a frequency multiplier 28 and a clock accumulation loop 30. The frequency multiplier 28 multiplies the base signal at the base frequency Fbase to a first reference signal at a first reference frequency Fref1. Importantly, the base frequency Fbase is preferred as 10 MHz or 100 MHz and the first reference frequency Fref1 is an integer multiple, for example eight, times the base frequency Fbase. It is noted that a base frequency of 100 MHz is an exact multiple of 10 MHz. In an alternative embodiment an external signal source may be used for providing the first reference frequency Fref1.

The clock accumulation loop 30 includes a phase frequency detector (PFD) 32, an error amplifier 34, a microwave tunable clock oscillator 36 and a clock synthesis binary accumulator 38. The accumulator 38 is in a feedback signal path 40 for the loop 30. The clock synthesis accumulator 38 operates in a signal feedback path for synthesizing the clock frequency Fclk. The output frequency from the oscillator 36 is controlled by a voltage from the error amplifier 34 to be the desired synthesized clock frequency Fclk. The error amplifier 34 provides the control voltage by amplifying an error voltage from the PFD 32 with an amplification factor that may be shaped to be non-linear according to an estimated voltage-to-frequency characteristic of the oscillator 36. In a preferred embodiment the oscillator 36 is a Yttrium Iron Garnet (YIG) tuned oscillator (YTO). In an alternative embodiment the oscillator 36 may be a voltage controlled oscillator (VCO) using a tunable frequency device such as the capacitance of a varactor diode or a transistor junction.

The error amplifier 34 includes a loop filter 39 for providing stability compensation elements by adding poles and zeroes to the open loop response of the clock accumulation loop 30 to increase the order of the loop 30 and to prevent oscillations of the loop 30. The bandwidth of the loop filter 39 must be low enough to filter the close-in spurious sideband signals from the first reference signal and the feedback signal from the accumulator 38, and low enough so that multiplied wide band phase noise on the first reference frequency Fref1 and the feedback signal are prevented from modulating the oscillator 36. The loop filter 39 bandwidth must be high enough so that the close-in phase noise on the clock frequency Fclk is no more than the multiplied close-in phase noise of the base frequency Fbase. The terms "close-in" and "wide band" refer to spectral difference with respect to the clock frequency Fclk. Since fast switching is not required for the clock frequency Fclk, the bandwidth of the loop 30 may be relatively narrow.

The PFD 32 uses exclusive-or gates for comparing phase and frequency of the first reference signal to phase and frequency of the feedback signal from the accumulator 38. In a preferred embodiment the PFD 32 reacts to the negative transitions of the first reference signal and the feedback signal. When the frequencies are not equal the PFD 32 provides the error voltage to the error amplifier 34 to drive the oscillator 36 until the frequencies are equal. When the frequencies are equal, the PFD 32 provides the error voltage to the error amplifier 34 to control the oscillator 36 to minimize the phase difference between the first reference signal and the feedback signal.

Since no fast frequency switching occurs in the loop 30, it is possible to use a mixer in place of the PFD 32. The mixer may have an advantage of contributing lower phase noise to the clock signal frequency Fclk. The bandwidth of the loop 30 is dimensioned in order to lock the oscillator 36 under all operating environmental conditions.

The accumulator 38 effectively divides the synthesized clock frequency Fclk by a variable divide factor for providing the feedback signal. Because the PFD 32 compares the first reference frequency Fref1 to the divided frequency, the divide factor effectively multiplies the first reference frequency Fref1 to provide the synthesized clock frequency Fclk. The accumulator 38 has a predetermined modulus $2^{Mclk}$. The divide factor is the accumulator modulus $2^{Mclk}$ divided by the clock seed word Kclk. A model MX1DS10P from Centellax, Inc. of Santa Rosa, Calif., can be used in the construction of such accumulator 38.

The synthesized output signal of the oscillator 36 is used by the accumulator 38 as a clock signal. The accumulator 38 uses the clock signal with the clock seed word Kclk and the accumulator modulus $2^{Mclk}$ for providing an accumulation value. The accumulation value has word length of Mclk bits having a most significant bit (MSB) and less significant bits (LSB)s. The accumulation value is used for a feedback word. The MSB of the feedback word is used for the feedback signal to the PFD 32.

In operation, the accumulator 38 starts a cycle with the LSBs of the accumulation value. At each cycle of the synthesized clock signal the accumulator 38 adds (accumulates) the clock seed word Kclk to the accumulation value. The clock seed word Kclk is accumulated one or several times on top of the previous accumulation value until the accumulation value reaches or exceeds the value of the accumulator modulus $2^{Mclk}$. When the value of the accumulator modulus $2^{Mclk}$ is reached or exceeded the MSB of the accumulation value overflows. At the MSB overflow, the LSBs become the accumulation value and the cycle begins again. The frequency of the feedback signal is the frequency of the MSB overflows.

The accumulator 38 adds the clock seed word Kclk to the accumulation value indefinitely at the stroke of the synthesized clock signal from the YTO 36. This functionality yields a feedback signal having steps at the synthesized clock frequency Fclk. The average frequency of the feedback signal (MSB overflow frequency) is directly proportional to the synthesized clock frequency Fclk and the size of the word Kclk being accumulated and inversely proportional to the accumulator modulus $2^{Mclk}$. Using the clock seed word Kclk, the average frequency of the feedback signal is the synthesized clock frequency Fclk times the clock seed word Kclk divided by the accumulator modulus $2^{Mclk}$.

The largest value for the clock seed word Kclk is slightly less than one-half the accumulator modulus $2^{Mclk}$. This means that the average MSB overflow frequency has a range of the synthesized clock frequency Fclk divided by the accumulator modulus $2^{Mclk}$ (for Kclk=1) to slightly less than one-half of the synthesized clock frequency Fclk (for Kclk slightly less than $\frac{1}{2} \times 2^{Mclk}$).

The feedback signal is passed from the accumulator 38 to the PFD 32 as an MSB signal having a frequency and phase corresponding to the changes of the MSB of the feedback word. The MSB signal may be the MSB bit having alternate high and low states or a pulse that is triggered by transitions of the MSB bit. The pulse may be triggered when the MSB overflows (transitions from a high to a low state) or when the MSB increments (transitions from a low to a high state). The PFD 32 may be constructed to react to the central energy of the MSB signal, or to a high to low transition of the MSB signal, or a low to high transition of the MSB signal, or a combination of the high to low and low to high transitions.

The MSB signal has a precise average frequency that is determined by the synthesized clock frequency Fclk, the clock seed word Kclk and the accumulator modulus $2^{Mclk}$, but the spectrum of the MSB signal includes spurious signals around the desired frequency. The accumulation loop 30 filters the spurious signals by an amount determined by the spectral (frequency) separation ΔSS between the desired frequency and the spurious frequency; and the filtering action from the bandwidth of the closed loop response of the accumulation loop 30. The loop filter 39 primarily determines this bandwidth.

Figure 3:
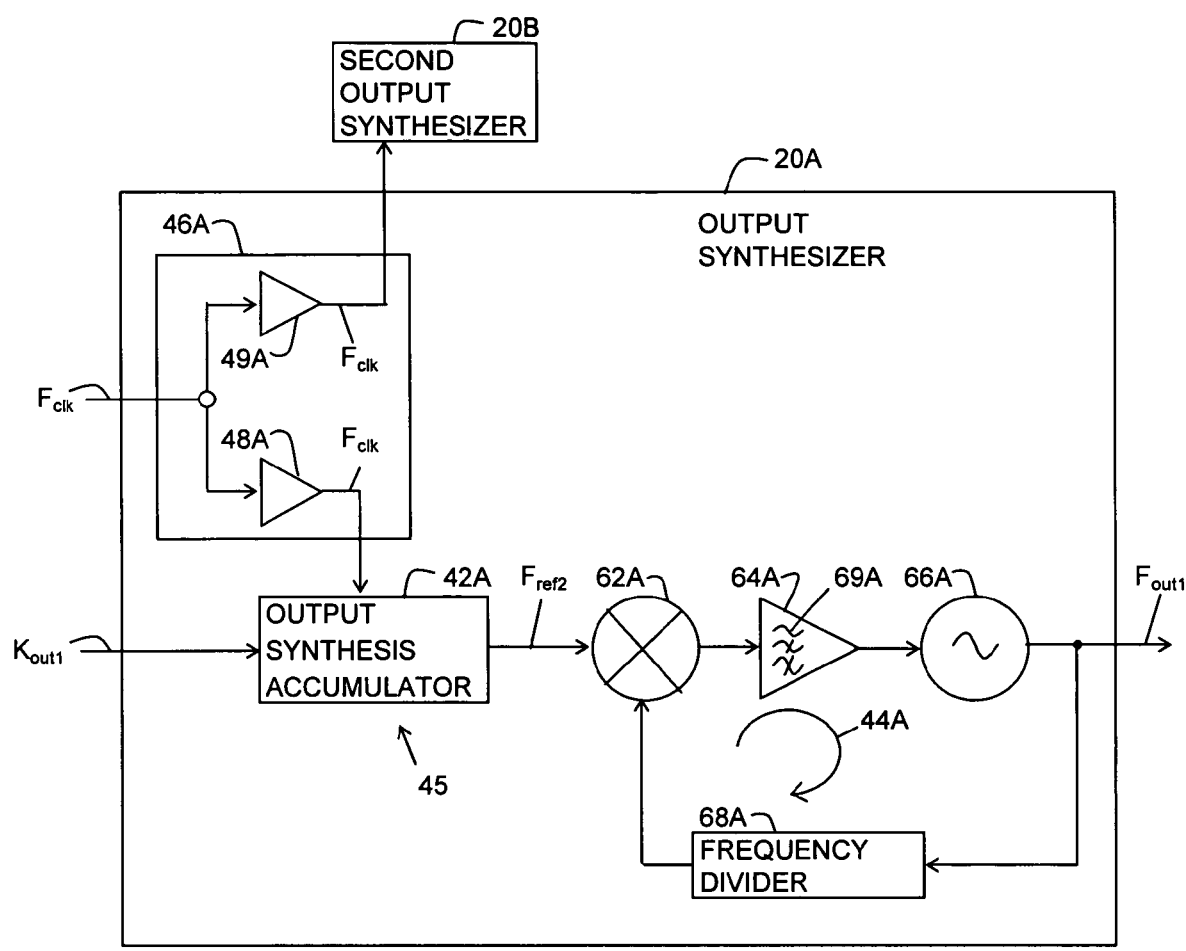
FIG. 3 is a block diagram of an output synthesizer of the decimal frequency synthesizer of FIG. 1.

FIG. 3 is a block diagram of the output synthesizer 20A for providing the output frequency Fout1. When frequency synthesizer 10 includes two or more output synthesizers 20A-N for providing two or more output frequencies Fout1-FoutN, the output synthesizers 20B-N can be identical or nearly identical to each other and the output synthesizer 20A.

The output synthesizer 20A includes an output synthesis binary accumulator 42A and tracking filter 44A. The output synthesis accumulator 42A operates in a forward or "in-line" signal path 45 for synthesizing the output frequency Fout from the clock frequency Fclk. When two or more output frequencies Fout1-FoutN are desired, the output synthesizer 20A also includes a splitter 46A. The splitter 46A includes a first amplifier 48A for passing the synthesized clock frequency Fclk to the output accumulator 42A for the first output synthesizer 20A and a second amplifier 49A for passing the synthesized clock frequency Fclk to the second output synthesizer 20B. The second output synthesizer 20B provides the second output frequency Fout2 and passes the synthesized clock frequency Fclk to the next one of the output synthesizers, and so on in a chain for all the output synthesizers 20A-N for providing all the output frequencies Fout1-FoutN. In this way, the synthesized clock signal is passed from one of the output synthesizers 20A-N to the next for synthesizing N output frequencies Fout1-FoutN. Each different output frequency Fout1, Fout2 through FoutN is a function of the same first reference frequency Fref1, the same clock seed word Kclk, and the different output seed words Kout1, Kout2 through KoutN that are calculated for the output frequencies Fout1, Fout2 through FoutN.

The below description of the output synthesizer 20A, the accumulator 42A and the tracking filter 44A may be applied to all of the output synthesizers 20A-N. Further, the terms output frequency Fout, output frequency step size ΔF, output clock word Kout and output seed word step size ΔKout are used below for describing the output frequencies Fout1-FoutN, output frequency step sizes ΔF1-ΔFN, output clock words Kout1-KoutN and output seed word step sizes ΔKout1-ΔKoutN.

The accumulator 42A effectively divides the synthesized clock frequency Fclk from the clock synthesizer 16 by a variable fractional divide factor for providing a second reference signal at a second reference frequency Fref2 to the tracking filter 44A. The divide factor is an accumulator modulus $2^{Mout}$ divided by the output seed word Kout. A model MX1DS10P from Centellax, Inc. of Santa Rosa, Calif., can be used in the construction of such accumulator 42A.

Importantly, the accumulator 42A is in an "in-line" or forward signal path 45 and the clock accumulator 38 is in a feedback signal path 40 for synthesizing frequencies that lead to the output frequency Fout. It is this combination of in-line signal path operations and feedback signal path operations that enables the synthesizer 10 to use binary devices (the accumulators 38 and 42A) for providing a decimal conversion of the decimal base reference frequency to the decimal output frequency Fout and the frequency steps ΔF.

The accumulator 42A uses the clock frequency Fclk with the output seed word Kout and the accumulator modulus $2^{Mout}$ for providing an accumulation value. The accumulation value has bit length of Mout having a most significant bit (MSB) and less significant bits (LSB)s. The accumulation value is used for a reference word. The MSB of the reference word is used for the second reference signal to the tracking filter 44A. This MSB is termed an "in-line" MSB because it is used in a forward signal synthesis path.

In operation, the accumulator 42A starts a cycle with the LSBs of the accumulation value. At each cycle of the synthesized clock frequency Fclk the accumulator 42A adds (accumulates) the output seed word Kout to the accumulation value. The output seed word Kout is accumulated one or several times on top of the previous accumulation value until the accumulation value reaches or exceeds the value of the accumulator modulus $2^{Mout}$. When the value of the accumulator modulus $2^{Mout}$ is reached or exceeded the MSB of the accumulation value overflows. At the MSB overflow, the LSBs become the accumulation value and the cycle begins again. The second reference frequency Fref2 is the frequency of the MSB overflows.

The accumulator 42A adds the output seed word Kout to the accumulation value indefinitely at the stroke of the synthesized clock signal. This functionality yields a second reference signal having steps at the synthesized clock frequency Fclk. The average frequency of the second reference signal (MSB overflow frequency) is directly proportional to the synthesized clock frequency Fclk and the size of the word Kout being accumulated and inversely proportional to the accumulator modulus $2^{Mout}$. Using the output seed word Kout, the average frequency of the second reference signal is the synthesized clock frequency Fclk times the output seed word Kout divided by the accumulator modulus $2^{Mout}$.

The largest value that the output seed word Kout can take is slightly less than one-half the accumulator modulus $2^{Mout}$. This means that the average MSB overflow frequency has a range of the synthesized clock frequency Fclk divided by the accumulator modulus $2^{Mout}$ (for Kout=1) to slightly less than one-half of the synthesized clock frequency Fclk (for Kout slightly less than $½ \times 2^{Mout}$).

The second reference signal is passed from the accumulator 42A to the tracking filter 44A as an MSB signal having the second reference frequency Fref2 and a phase corresponding to the changes of the MSB of the reference word. The MSB signal may be the MSB bit having alternate high and low states or a pulse that is triggered by transitions of the MSB bit. The pulse may be triggered when the MSB overflows (transitions from a high to a low state) or when the MSB increments (transitions from a low to a high state).

The MSB signal has a precise average frequency that is determined by the synthesized clock frequency Fclk, the output seed word Kout and the accumulator modulus $2^{Mout}$, but the spectrum of the MSB signal includes spurious signals around the desired frequency. The tracking filter 44A filters the spurious signals by an amount determined by the spectral (frequency) separation ΔSS between the desired frequency and the spurious frequency; and the filtering action from the bandwidth of the tracking filter 44A.

The tracking filter 44A receives the MSB signal and applies a bandpass filter that tracks the average frequency of the MSB overflows (or a multiple of that frequency) in order to greatly reduce the levels of undesired spurious frequencies. The frequency tracking may be constructed to react to the central energy of the MSB signal, or a high to low transition of the MSB signal, or a low to high transition of the MSB signal, or a combination of the high to low and low to high transitions. Such bandpass filtering may be accomplished with a tracking filter constructed with tunable resonant material such as bulk Yttrium Iron Garnet (YIG) or a device such as a varactor diode that is tuned with a voltage derived from the clock frequency Fclk, the output seed word Kout and the output modulus $2^{Mout}$ to resonate at the average MSB overflow frequency. However, the preferable implementation of the present invention uses an output feedback loop for the tracking filter 44A where the frequency of the MSB signal is the reference frequency for the loop.

In the sections below the tracking filter 44A is described as an output loop 44A. The output loop 44A is preferably a phase lock loop. The accumulator 42A passes the MSB signal to the output loop 44A.

The output loop 44A includes a phase frequency detector (PFD) 62A, an error amplifier 64A, a voltage controlled output oscillator (VCO) 66A and a frequency divider 68A. The output signal frequency Fout from the VCO 66A is controlled with a voltage provided by the error amplifier 64A. The error amplifier 64A provides the control voltage by amplifying an error voltage from the PFD 62A with an amplification factor that may be non-linearly shaped according to an estimated voltage-to-frequency characteristic of the VCO 66A. The VCO 66A can use YIG material, a varactor diode or capacitance of a transistor junction as a voltage tunable resonator.

The error amplifier 64A includes a loop filter 69A for providing stability compensation elements for adding poles and zeroes to the open loop response in order to increase the order of the loop 44A and to prevent oscillations of the loop 44A. The loop filter 69A bandwidth must be low enough to filter the close-in spurious sideband signals from the phase steps of the second reference signal and low enough so that multiplied wide band phase noise in the second reference signal is prevented from modulating the VCO 66A. The loop filter 69A bandwidth must be high enough so that the close-in phase noise of the output signal is no more than the multiplied close-in phase noise of the second reference signal and high enough to allow fast switching between output frequencies from the VCO 66A. The term "close-in" refers to spectral difference with respect to the output frequency. For a wide frequency range Foutmin to Foutmax of more than one or two octaves of output frequencies Fout, two more physical oscillators may be used for the function of the oscillator 66A.

The PFD 62A uses exclusive-or gates for comparing phase and frequency of the MSB signal to phase and frequency of a feedback signal from the frequency divider 68A. In practice the PFD 62A has a maximum operating frequency referred to as Fref2max as the maximum for the second reference frequency Fref2. In a preferred embodiment the PFD 62A reacts to the negative transition (1 to 0) of the MSB when the MSB overflows. When the frequencies are not equal the PFD 62A provides the error voltage to the error amplifier 64A to drive the VCO 66A until the frequencies are equal. When the frequencies are equal, the PFD 62A provides the error voltage to the error amplifier 64A to control the VCO 66A to minimize the phase difference between the MSB signal and the feedback signal.

The frequency divider 68A divides the output signal frequency by a factor C for providing the feedback signal having a frequency of 1/C of the output signal frequency. Because the PFD 62A compares the MSB overflow frequency to a frequency that is 1/C of the output frequency Fout1, the output loop 44A effectively multiplies the MSB frequency from the output accumulator 42A by the factor C. In a preferred embodiment, the factor C is a fixed number that is an integer power of two, for example $2^0$ for 1, $2^1$ for 2, $2^2$ for 4, $2^3$ for 8, and so on.

The output synthesizers 20A-N include tracking filters or output loops 44A-N, respectively, having frequency dividers 68A-N, respectively. The divide factor C may be the same or different for each of the frequency dividers 68A-N. The VCOs 66A-N may be constructed differently for different output frequencies Fout1-FoutN.

Frequency dividers may be used for dividing the clock frequency Fclk at the clock inputs to one or both of the accumulators 38 and 42A or for dividing the MSB signal frequency at the outputs of one or both of the accumulators 38 and 42A. Divide factors of two are preferred for their low cost and easy implementation. Because they are simple to implement, they can work at very high frequencies.

Figure 4:
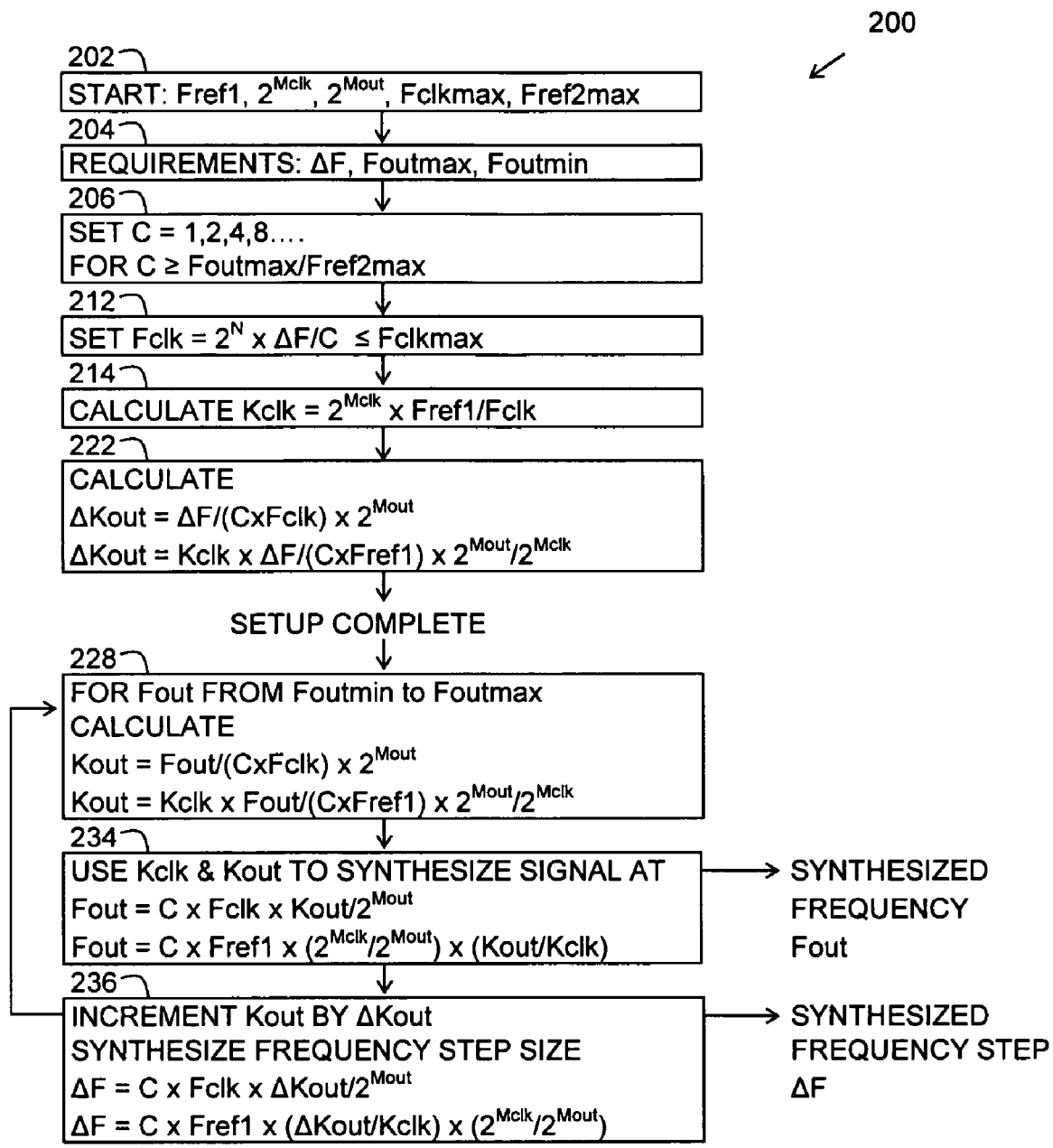
FIG. 4 is a flow chart of a method of the present invention for synthesizing multiples of decimal frequencies.

FIG. 4 is a flow chart a method of the present invention for synthesizing a desired output frequency Fout having frequency steps ΔF that are exact multiples of a decimal frequency. Any one or all the steps of the method may be encoded into a tangible medium 200 that is manufactured in a form to be readable by a computer or computing device for directing an apparatus for carrying out the step or steps.

At the start 202 the first reference frequency Fref1, the modulus $2^{Mclk}$ for the binary clock accumulator 38, the modulus $2^{Mout}$ for the binary output accumulator 42A, the Fclkmax for the maximum clock rate Fclk of the clock and output accumulators 38 and 42A, and Fref2max for the maximum second reference frequency Fref2 are decided upon based on practical considerations of the cost and availability of microwave hardware. The maximum second reference frequency is the maximum operating frequency of the PFD 62A. In a step 204 the requirements are specified for the frequency step size ΔF and frequency range Foutmin to Foutmax of the output frequency Fout.

The divide factor C is selected in a step 206 for C≧Foutmax/Fref2max. The divide factor C is preferably the smallest number that is an integer power of two (for practical reasons), for example 1,2,4,8, and so on. In a step 212 the clock frequency Fclk is calculated as Fclk=$2^N$×ΔF/C where N is an integer and Fclk is less than or equal to Fclkmax. In a step 214 the clock seed word Kclk is calculated as Kclk=$2^{Mclk}$× Fref1/Fclk as an integer between 1 and $2^{(Mout-1)}$. In a step 222 the clock seed word step size is calculated as ΔKout=ΔF/(C× Fclk)×$2^{Mout}$ or ΔKout=Kclk×ΔF/(C×Fref1)×$2^{Mout}/2^{Mclk}$. The setup calculations for the clock seed word Kclk, output seed word Kout and the output seed word step size ΔKout are now complete. The output seed words Kout-KoutN and output seed word step sizes ΔKout1-ΔKoutN are calculated for each of the output frequencies Fout1-FoutN.

The synthesizer 10 is now setup to synthesize the output frequencies from Foutmin to Foutmax in ΔF frequency steps. In a step 228 the output seed word Kout is generated as Kout=Fout/(C×Fclk)×$2^{Mout}$ or Kout=Kclk×Fout/(C×Fref1)× $2^{Mout}/2^{Mclk}$. In a step 234 the synthesizer 10 synthesizes the output signal at output frequency as Fout=C×Fclk×Kout/ $2^{Mout}$ or Fout=C×Fref1×$2^{Mclk}/2^{Mout}$×Kout/Kclk. In a step 236 the output seed word Kout is incremented by the step size ΔKout until the output frequency Fout has covered the range from Foutmin to Foutmax in steps ΔF=C×Fclk×ΔKout/$2^{Mout}$ or ΔF'C×Fref1×ΔKout/Kclk×$2^{Mclk}/2^{Mout}$.

Switching Speed

The spurious signal frequencies carried on the synthesized output signal have a spectral separation ΔSS of the frequency step size ΔF from the output frequency Fout. The frequency bandwidth of the output loop 44A is primarily determined by the loop filter 69A. This bandwidth is judicially designed so that the bandwidth is about five to ten times the spectral separation ΔSS. The switching speed of the frequency steps ΔF is directly proportional to the bandwidth.

The signal switching path is the path where the frequency of the signal must be switched in order to change the output frequency Fout. The signals in the signal switching path must have fast switching in order to provide fast switching in the output frequency Fout. The signal switching path of the present invention is the output synthesizer 20 including the binary accumulator 42A and the output loop 44A. The base oscillator 12 and the clock synthesizer 16 are not part of the signal switching path. The loop 44A is the only phase lock loop in the signal switching path of the present invention.

Therefore, the apparatus of the present invention is termed a single loop synthesizer. The significance of whether a phase lock loop is in the signal switching path is that phase lock loops in the signal switching path inevitably degrade the switching speed; and require more cost, size and power in order to minimize that degradation, than a loop that is not in the signal switching path. The switching time of the frequency synthesizer 10 depends upon the bandwidth of the loop 44A which is designed to be directly dependent on the step size ΔF of the output frequency Fout so that the switching speed may be faster when the frequency step size ΔF is increased.

EXAMPLE

A specific example is described for frequencies and frequency multiplications (including frequency divisions). However, it should be noted that the idea of the invention is not limited to these numbers. For the example: Fbase=100 MHz, Fref1=800 MHz, Mclk=20, Mout=20, ΔF=2 MHz, Foutmin=6 GHz, Foutmax=11 GHz, C=4, Fclkmax=15 GHz, Fref2max=5 GHz, Fclk=10.048576 GHz, Kclk=80000 and ΔKout=50. For the minimum output frequency Foutmin=6 GHz, Kout=150,000; for the next output frequency step ΔF of 2 MHz, Kout=150050 for Fout=6.002 GHz; for the next output frequency step ΔF of 2 MHz, Kout=150100 for the output frequency Fout=6.004 GHz; and so on for the last output frequency step ΔF of 2 MHz, Kout=275000 for the maximum output frequency Fout=11 GHz. It should be noted that the frequency steps ΔF of the present invention may be synthesized in exact multiples of 10 kHz, With Fbase=100 MHz, Fref1=800 MHz, Mclk=20, Mout=20, Fclkmax=15 GHz, Fclk=10.048576 GHz, C=1 and ΔKout=1.

Decimal Frequencies and Frequency Steps

A "decimal frequency" is defined as a frequency at an integer multiple of ten Hertz. Similarly, a "decimal frequency step" is defined as a frequency step at an integer multiple of ten Hertz. In preferred embodiments, decimal output frequencies Fout are frequencies within the range one to one-hundred gigahertz at multiples of 10 kHz, 100 kHz, 125 kHz, 200 kHz, 500 kHz, 1 MHz, 2 MHz and the like; and decimal frequency steps ΔF are 10 kHz, 100 kHz, 125 kHz, 200 kHz, 500 kHz, 1 MHz, 2 MHz and the like.

A "decimal division" is defined as division by a number that is an integer times a multiple of an integer power of ten where the power is one or more. The decimal division number has the form $A \times 10^n$ where A and n are integers. In preferred embodiments, decimal division numbers are $1 \times 10^4$, $1 \times 10^3$, $8 \times 10^2$, $5 \times 10^2$, $2 \times 10^2$, $1 \times 10^2$, $5 \times 10^1$ and the like.

The preferred embodiments described above provide frequency steps ΔF at multiples of ten Hertz to the power of four or greater ($10^4$ Hertz or greater) times the factor C. For a preferred embodiment, a requirement of integer increments in the clock seed word prevents multiples of ten Hertz to the power of zero (one Hertz) times the factor C, and a requirement of integer increments in the output seed word prevents frequency steps ΔF in multiples of ten Hertz to the powers one, two and three (10, 100 and 1000 Hertz) times the factor C. However, longer words (more bits) for the clock and output synthesis modulus values Mclk and Mout, a lower frequency for the base reference frequency Fbase (10 MHz in place of 100 MHz), or a lower frequency for the first reference frequency Fref1 can be used to provide these frequency steps.

Forward and Feedback Signal Paths

A "forward signal path" is defined as a signal path from an independent input signal to an output signal. The output signal depends on the input signal but the independent input signal does not depend on the output signal. In a preferred embodiment the clock signal having frequency Fclk is the independent input signal and the second reference signal having frequency Fref2 is the output signal for the forward signal path 45.

A "feedback signal path" is defined as a signal path having a feedback output signal that is compared with an independent input signal for providing a closed loop output signal where the closed loop output signal is used as a dependent input signal to the feedback signal path. The independent input signal does not depend on the feedback output signal or the closed loop output signal. The closed loop output signal depends on itself (through the feedback signal path to the feedback output signal) and the independent input signal. The signal path from the independent input signal to the closed loop output signal is a forward signal path. In a preferred embodiment the first reference signal having the frequency Fref1 is the independent input signal, the MSB signal from the clock synthesis accumulator 38 is the feedback output signal and the clock signal having the clock frequency Fclk is the closed loop output signal.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering the alterations and modifications as fall within the true spirit and scope of the invention.

What is claimed is:

1. A frequency synthesizer, comprising:
  a clock synthesizer having a clock synthesis accumulator for accumulating a selected clock seed word with a clock frequency in a feedback signal path for synthesizing said clock frequency from a base reference frequency;
  an output synthesizer having an output synthesis accumulator for accumulating selected output seed words at the rate of said clock frequency in a forward signal path for synthesizing output frequencies, respectively, with frequency steps at exact decimal divisions of said base reference frequency; and wherein:
  the output synthesizer further includes a tracking filter including an output oscillator for providing a one of said output frequencies according to a phase comparison between a feedback signal derived from an output signal at said one of said output frequencies and a second reference signal derived from an MSB signal; and
  said output synthesis accumulator is constructed for accumulating, at said clock frequency, a one of said output seed words corresponding to said one of said output frequencies for updating an accumulation value having a most significant bit (MSB) for providing said MSB signal.

2. The frequency synthesizer of claim 1, wherein:
  the tracking filter includes a phase lock loop having a frequency divider in a feedback path for frequency multiplying said MSB signal for providing said one of said output frequencies.

3. The frequency synthesizer of claim 1, further comprising:
  a second output synthesizer having a second output synthesis accumulator using the same said clock frequency and second selected output seed words in a second forward signal path for synthesizing second output frequencies at second decimal divisions of said base reference frequency, whereby two different said output frequencies are simultaneously synthesized from the same said clock frequency.

4. A frequency synthesizer, comprising:
  a clock synthesizer having a clock synthesis accumulator for accumulating a selected clock seed word with a clock frequency in a feedback signal path for synthesizing said clock frequency from a base reference frequency;
  an output synthesizer having an output synthesis accumulator for accumulating selected output seed words at the rate of said clock frequency in a forward signal path for synthesizing output frequencies, respectively, with frequency steps at exact decimal divisions of said base reference frequency; and
  a seed generator for generating said clock seed word as a function of said base reference frequency and a modulus of said clock synthesis accumulator.

5. The frequency synthesizer of claim 4, wherein:
  the clock synthesizer includes a clock oscillator for providing said clock frequency according to a phase comparison between an MSB signal corresponding to a most significant bit (MSB) from said clock synthesis accumulator and a first reference signal at a first reference frequency corresponding to a multiple of said base reference frequency; and
  said clock synthesis accumulator is constructed for accumulating said clock seed word at said clock frequency for updating an accumulation value word having said MSB.

6. The frequency synthesizer of claim 4, wherein:
  the seed generator is constructed for generating said clock seed word and said output seed words for providing decimal frequency steps for said output frequencies when said base reference frequency is a decimal frequency, where said decimal divisions are exactly equal to integers times multiples of integer powers of ten, said powers equal to one or more.

7. The frequency synthesizer of claim 6, wherein:
said decimal frequency steps are a multiple of ten kHz when said base reference frequency is one hundred MHz.

8. The frequency synthesizer of claim 4, wherein:
said clock seed word is proportional to $2^{Mclk} \times (Fref1/2^N)$ where $2^{Mclk}$ is said modulus of said clock synthesis accumulator, Fref1 is a first reference frequency at an integer multiple of said base reference frequency, and N is an integer.

9. A frequency synthesizer, comprising:
a clock synthesizer having a clock synthesis accumulator for accumulating a selected clock seed word with a clock frequency in a feedback signal path for synthesizing said clock frequency from a base reference frequency;
an output synthesizer having an output synthesis accumulator for accumulating selected output seed words at the rate of said clock frequency in a forward signal path for synthesizing output frequencies, respectively, with frequency steps at exact decimal divisions of said base reference frequency; and
a seed generator for generating a one of said output seed words as a function of said clock seed word, said base reference frequency, a modulus of said clock synthesis accumulator, a modulus of said output synthesis accumulator, and a one of said output frequencies corresponding to said one of said output seed words.

10. The frequency synthesizer of claim 9, wherein:
said one of said output seed words is proportional to $Kclk \times Fout/Fref1 \times 2^{Mout}/2^{Mclk}$ where Kclk is said clock seed word, Fout is said one of said output frequencies, Fref1 is a first reference frequency at an integer multiple of said base reference frequency, $2^{Mout}$ is said modulus of said output synthesis accumulator and $2^{Mclk}$ is said modulus of said clock synthesis accumulator.

11. The frequency synthesizer of claim 9, wherein:
the seed generator is constructed for generating said clock seed word and said output seed words for providing decimal frequency steps for said output frequencies when said base reference frequency is a decimal frequency, where said decimal divisions are exactly equal to integers times multiples of integer powers of ten, said powers equal to one or more.

12. A frequency synthesizer, comprising:
a clock synthesizer having a clock synthesis accumulator for accumulating a selected clock seed word with a clock frequency in a feedback signal path for synthesizing said clock frequency from a base reference frequency;
an output synthesizer having an output synthesis accumulator for accumulating selected output seed words at the rate of said clock frequency in a forward signal path for synthesizing output frequencies, respectively, with frequency steps at exact decimal divisions of said base reference frequency; and
a seed generator for generating said output seed words according to (i) an output seed word increment, said increment a function of said clock seed word, (ii) a step size of said output frequencies, (iii) said base reference frequency, (iv) a modulus of said clock synthesis accumulator and (v) a modulus of said output synthesis accumulator.

13. The frequency synthesizer of claim 12, wherein:
said output seed word increment is proportional to $Kclk \times \Delta F/Fref1 \times 2^{Mout}/2^{Mclk}$ where Kclk is said clock seed word, $\Delta F$ is said output frequency step size, Fref1 is a first reference frequency at an integer multiple of said base reference frequency, $2^{Mout}$ is said modulus of said output synthesis accumulator and $2^{Mclk}$ is said modulus of said clock synthesis accumulator.

14. The frequency synthesizer of claim 12, wherein:
the seed generator is constructed for generating said clock seed word and said output seed words for providing decimal frequency steps for said output frequencies when said base reference frequency is a decimal frequency, where said decimal divisions are exactly equal to integers times multiples of integer powers of ten, said powers equal to one or more.

15. A method for synthesizing a frequency, comprising:
accumulating a selected clock seed word with a clock frequency in a feedback signal path for synthesizing said clock frequency from a base reference frequency;
accumulating selected output seed words with said clock frequency in a forward signal path for synthesizing output frequencies, respectively, with frequency steps at exact decimal divisions of said base reference frequency; and
generating said clock seed word as a function of said base reference frequency and a modulus for accumulating said clock seed word.

16. The method of claim 15, wherein:
accumulating said clock seed word includes: controlling said clock frequency according to a phase comparison between an MSB signal corresponding to a most significant bit (MSB) of a clock synthesis accumulation value and a first reference signal at a first reference frequency corresponding to a multiple of said base reference frequency; and accumulating said clock seed word at said clock frequency for updating said clock synthesis accumulation value word having said MSB.

17. The method of claim 15, further comprising:
controlling a one of said output frequencies according to a phase comparison between a feedback signal derived from an output signal at said one of said output frequencies and a second reference signal derived from an MSB signal; and wherein:
accumulating said output seed words includes updating an accumulation value having a most significant bit (MSB) for providing said MSB signal at said clock frequency, a one said output seed words corresponding to said one of said output frequencies.

18. The method of claim 17, wherein:
controlling said one of said output frequencies includes frequency dividing said output signal by a factor for providing said feedback signal for frequency multiplying said MSB signal by said factor for providing said one of said output frequencies.

19. The method of claim 15, further comprising:
generating said clock seed word and said output seed words for providing said output frequencies at decimal frequency steps when said base reference frequency is a decimal frequency, where said decimal divisions are exactly equal to integers times multiples of integer powers of ten, said powers equal to one or more.

20. The method of claim 19, wherein:
said decimal frequency steps are a multiple of ten kHz when said base reference frequency is one hundred MHz.

21. The method of claim 15, wherein:
said clock seed word is proportional to $2^{Mclk} \times (Fref1/2^N)$ where $2^{Mclk}$ is said modulus for accumulating said clock seed word, Fref1 is a first reference frequency at an integer multiple of said base reference frequency, and N is an integer.

22. A method for synthesizing a frequency, comprising:
accumulating a selected clock seed word with a clock frequency in a feedback signal path for synthesizing said clock frequency from a base reference frequency;
accumulating selected output seed words with said clock frequency in a forward signal path for synthesizing output frequencies, respectively, with frequency steps at exact decimal divisions of said base reference frequency; and
generating a one of said output seed words as a function of said clock seed word, said base reference frequency, a modulus for accumulating said clock seed word, a modulus for accumulating said output seed words, and a one of said output frequencies corresponding to said one of said output seed words.

23. The method of claim 22, wherein:
said one of said output seed words is proportional to $Kclk \times Fout/Fref1 \times 2^{Mout}/2^{Mclk}$ where Kclk is said clock seed word, Fref1 is a first reference frequency at an integer multiple of said base reference frequency, $2^{Mout}$ is said modulus for accumulating said output seed words and $2^{Mclk}$ is said modulus for accumulating said clock seed word, and Fout is said one of said output frequencies.

24. The method of claim 22, further comprising:
generating said clock seed word and said output seed words for providing said output frequencies at decimal frequency steps when said base reference frequency is a decimal frequency, where said decimal divisions are exactly equal to integers times multiples of integer powers of ten, said powers equal to one or more.

25. A method for synthesizing a frequency, comprising:
accumulating a selected clock seed word with a clock frequency in a feedback signal path for synthesizing said clock frequency from a base reference frequency;
accumulating selected output seed words with said clock frequency in a forward signal path for synthesizing output frequencies, respectively, with frequency steps at exact decimal divisions of said base reference frequency; and
generating said output seed words according to (i) an output seed word increment, said increment a function of said clock seed word, (ii) a step size for said output frequencies, (iii) said base reference frequency, (iv) a modulus for accumulating said clock seed word and (v) a modulus for accumulating said output seed words.

26. The method of claim 25, wherein:
said output seed word increment is proportional to $Kclk \times \Delta F/Fref1 \times 2^{Mout}/2^{Mclk}$ where Kclk is said clock seed word, $\Delta F$ is said output frequency step size, Fref1 is a first reference frequency at an integer multiple of said base reference frequency, $2^{Mout}$ is said modulus for accumulating said output seed words and $2^{Mclk}$ is said modulus for accumulating said clock seed word.

27. The method of claim 25, further comprising:
generating said clock seed word and said output seed words for providing said output frequencies at decimal frequency steps when said base reference frequency is a decimal frequency, where said decimal divisions are exactly equal to integers times multiples of integer powers of ten, said powers equal to one or more.

28. A method for synthesizing a frequency, comprising:
accumulating a selected clock seed word with a clock frequency in a feedback signal path for synthesizing said clock frequency from a base reference frequency;
accumulating selected output seed words with said clock frequency in a forward signal path for synthesizing output frequencies, respectively, with frequency steps at exact decimal divisions of said base reference frequency; and wherein:
accumulating said output seed words includes accumulating first and second output seed words with the same said clock frequency in first and second forward signal paths, respectively, for simultaneously synthesizing first and second output frequencies at first and second decimal divisions, respectively, of said base reference frequency, said second of said output frequencies different than said first of said output frequencies.

29. The method of claim 28, further comprising:
generating said clock seed word and said output seed words for providing said output frequencies at decimal frequency steps when said base reference frequency is a decimal frequency, where said decimal divisions are exactly equal to integers times multiples of integer powers of ten, said powers equal to one or more.

* * * * *